United States Patent
Han et al.

(10) Patent No.: US 9,947,785 B2
(45) Date of Patent: Apr. 17, 2018

(54) JUNCTION FIELD EFFECT TRANSISTOR AND MANUFACTURING METHOD THEREFOR

(71) Applicant: CSMC TECHNOLOGIES FAB1 CO., LTD., Wuxi New District (CN)

(72) Inventors: Guangtao Han, Wuxi New District (CN); Guipeng Sun, Wuxi New District (CN)

(73) Assignee: CSMC TECHNOLOGIES FAB1 CO., LTD., Jiangsu (CN)

(*) Notice: Subject to any disclaimer, the term of this patent is extended or adjusted under 35 U.S.C. 154(b) by 0 days.

(21) Appl. No.: 15/318,857

(22) PCT Filed: Jun. 30, 2015

(86) PCT No.: PCT/CN2015/082761
§ 371 (c)(1),
(2) Date: Dec. 14, 2016

(87) PCT Pub. No.: WO2016/000600
PCT Pub. Date: Jan. 7, 2016

(65) Prior Publication Data
US 2017/0133505 A1  May 11, 2017

(30) Foreign Application Priority Data
Jun. 30, 2014 (CN) .......................... 2014 1 0307930

(51) Int. Cl.
*H01L 29/66* (2006.01)
*H01L 29/78* (2006.01)
(Continued)

(52) U.S. Cl.
CPC ...... *H01L 29/7831* (2013.01); *H01L 29/0607* (2013.01); *H01L 29/105* (2013.01);
(Continued)

(58) Field of Classification Search
CPC .............................. H01L 29/808; H01L 29/47
See application file for complete search history.

(56) References Cited

U.S. PATENT DOCUMENTS 7,928,509 B2 * 4/2011 Huang ................ H01L 27/0727
257/348
8,207,559 B2 * 6/2012 Babcock ............... H01L 27/095
257/280
(Continued)

FOREIGN PATENT DOCUMENTS

CN 101350351 A 1/2009
CN 102751277 A 10/2012
(Continued)

OTHER PUBLICATIONS

Office Action (and English Translation thereof) for Chinese Application No. 201410307930.1, dated Aug. 2, 2017 (10 pages).
(Continued)

Primary Examiner — Jamie C Niesz
(74) Attorney, Agent, or Firm — Kagan Binder, PLLC

(57) ABSTRACT

The present invention relates to a junction field effect transistor. The junction field effect transistor comprises a substrate (10), a buried layer in the substrate, a first well region (32) and a second well region (34) that are on the buried layer, a source lead-out region (50), a drain lead-out region (60), and a first gate lead-out region (42) that are in the first well region (32), and a second gate lead-out region (44) in the second well region (34). A Schottky junction interface (70) is disposed on the surface of the first well region (32). The Schottky junction interface (70) is located between the first gate lead-out region (42) and the drain lead-out region (60), and is isolated from the first gate lead-out region (42) and the drain lead-out region (60) by means of isolation structures. The present invention also
(Continued)

relates to a manufacturing method for a junction field effect transistor.

13 Claims, 2 Drawing Sheets

(51) Int. Cl.
| | | |
|---|---|---|
| *H01L 29/40* | (2006.01) | |
| *H01L 29/47* | (2006.01) | |
| *H01L 29/10* | (2006.01) | |
| *H01L 29/49* | (2006.01) | |
| *H01L 29/423* | (2006.01) | |
| *H01L 29/06* | (2006.01) | |
| *H01L 29/808* | (2006.01) | |

(52) U.S. Cl.
CPC ...... *H01L 29/1045* (2013.01); *H01L 29/1083* (2013.01); *H01L 29/408* (2013.01); *H01L 29/4238* (2013.01); *H01L 29/47* (2013.01); *H01L 29/4916* (2013.01); *H01L 29/66484* (2013.01); *H01L 29/66681* (2013.01); *H01L 29/782* (2013.01); *H01L 29/808* (2013.01)

(56) References Cited

U.S. PATENT DOCUMENTS

| | | | | |
|---|---|---|---|---|
| 2007/0228422 A1* | 10/2007 | Suzuki | ............... | H01L 27/0605 257/213 |
| 2009/0020826 A1* | 1/2009 | Huang | ................. | H01L 29/782 257/371 |
| 2012/0267715 A1* | 10/2012 | Chou | ................. | H01L 29/1045 257/336 |
| 2014/0061731 A1* | 3/2014 | Chen | .................... | H01L 29/872 257/272 |

FOREIGN PATENT DOCUMENTS

| | | | |
|---|---|---|---|
| CN | 102842596 A | | 12/2012 |
| CN | 103178093 A | | 6/2013 |
| CN | 103296082 A | * | 9/2013 |
| CN | 103811490 A | | 5/2014 |

OTHER PUBLICATIONS

English Translation of International Search Report for International Application No. PCT/CN2015/082761, dated Oct. 10, 2015 (2 pages).
Deng et al., U.S. Appl. No. 14/902,516, International Application filed Jul. 29, 2014.
Zhong et al., U.S. Appl. No. 14/902,517, International Application filed Jul. 22, 2014.
Zhang et al., U.S. Appl. No. 14/902,519, International Application filed Aug. 19, 2014.
Wang et al., U.S. Appl. No. 14/902,302, International Application filed Sep. 2, 2014.
Zhang et al., U.S. Appl. No. 15/023,049, International Application filed Dec. 2, 2014.
Jing et al., U.S. Appl. No. 15/023,057, International Application filed Dec. 4, 2014.
Hu et al., U.S. Appl. No. 15/119,249, International Application filed May 8, 2015.
Wang et al., U.S. Appl. No. 15/119,289 International Application filed Apr. 29, 2015.
Qian et al., U.S. Appl. No. 15/119,311, International Application filed May 6, 2015.
Zhang et al., U.S. Appl. No. 15/308, 574, International Application filed May 4, 2015.
Hu et al., U.S. Appl. No. 15/312,146, International Application filed May 5, 2015.
Yao et al., U.S. Appl. No. 15/315,168, International Application filed Jun. 26, 2015.

* cited by examiner

JUNCTION FIELD EFFECT TRANSISTOR AND MANUFACTURING METHOD THEREFOR

FIELD OF THE INVENTION

The present invention relates to semiconductor devices, and more particular relates to a junction field effect transistor, and further relates to a method for manufacturing junction field effect transistor.

BACKGROUND OF THE INVENTION

Junction field effect transistor (JFET) is a commonly used device in the circuit. In some application occasions, JFET is required to have a greater breakdown voltage.

SUMMARY OF THE INVENTION

Accordingly, it is necessary to provide a junction field effect transistor having a high breakdown voltage and a method for manufacturing the same.

A junction field effect transistor includes: a substrate; a buried layer formed in the substrate; a first well region and a second well region formed on the buried layer; a source lead-out region, a drain lead-out region, and a first gate lead-out region which being formed in the first well region; and a second gate lead-out region formed in the second well region; wherein the substrate has a second doping type, the buried layer includes a second doping type buried layer, the first well region has a first doping type, the second well region has the second doping type, the first gate lead-out region and the second gate lead-out region have the second doping type, the source lead-out region and the drain lead-out region have the first doping type, the first doping type and the second doping type have opposite conductivity types, the first well region is provided with a Schottky junction on a surface thereof, the Schottky junction is located between the first gate lead-out region and the drain lead-out region, and the Schottky junction is isolated from the first gate lead-out region and the drain lead-out region by an isolation structure.

A method of manufacturing junction field effect transistor includes steps as follows: providing a substrate; forming a buried layer in the substrate by ion implantation; forming an epitaxial layer on the buried layer by epitaxy technology; forming a first well region and a second well region in the epitaxial layer by ion implantation and drive-in; forming an isolation structure on surfaces of the first well region and the second well region, the isolation structure provides an alignment reference for subsequent implantation of a gate electrode, a source electrode and a drain electrode; forming a gate structure including a first gate lead-out region formed in the first well region, a second gate lead-out region formed in the second well region, a gate oxide formed on the first gate lead-out region and the second gate lead-out region, and a polysilicon gate formed on the gate oxide; forming a source lead-out region and a drain lead-out region in the first well region by ion implantation; activating implanted ion by thermal annealing; and forming a metal or alloy structure on the first well region, wherein a portion of the isolation structure between first gate lead-out region and the drain lead-out region has a discontinuous structure, thereby enabling the metal or alloy structure in the region to directly contact the first well region below to form a Schottky junction, wherein the substrate has a second doping type, the buried layer includes a second doping type buried layer, the first well region has a first doping type, the second well region has the second doping type, the first gate lead-out region and the second gate lead-out region have the second doping type, the source lead-out region and the drain lead-out region have the first doping type, the first doping type and the second doping type have opposite conductivity types.

Aforementioned junction field effect transistor takes advantage of the Schottky junction above the N-type well to form a depletion region in the N-type drift region of the N-type well, so as to deplete the drift region, thereby achieving an object of improving the breakdown voltage.

BRIEF DESCRIPTION OF THE DRAWINGS

In order to illustrate the technical solution of the invention or prior art more clearly, hereinafter, a brief introduction of accompanying drawings employed in the description of the embodiments or the prior art is provided. It is apparent that accompanying drawings described hereinafter merely are several embodiments of the invention. For one skilled in the art, other drawings can be obtained according to the accompanying drawings, without a creative work

DETAILED DESCRIPTION OF THE EMBODIMENTS

The above and other objects, features and advantages of the present invention will become more apparent by describing in detail with reference to the accompanying drawings.

Figure 1:
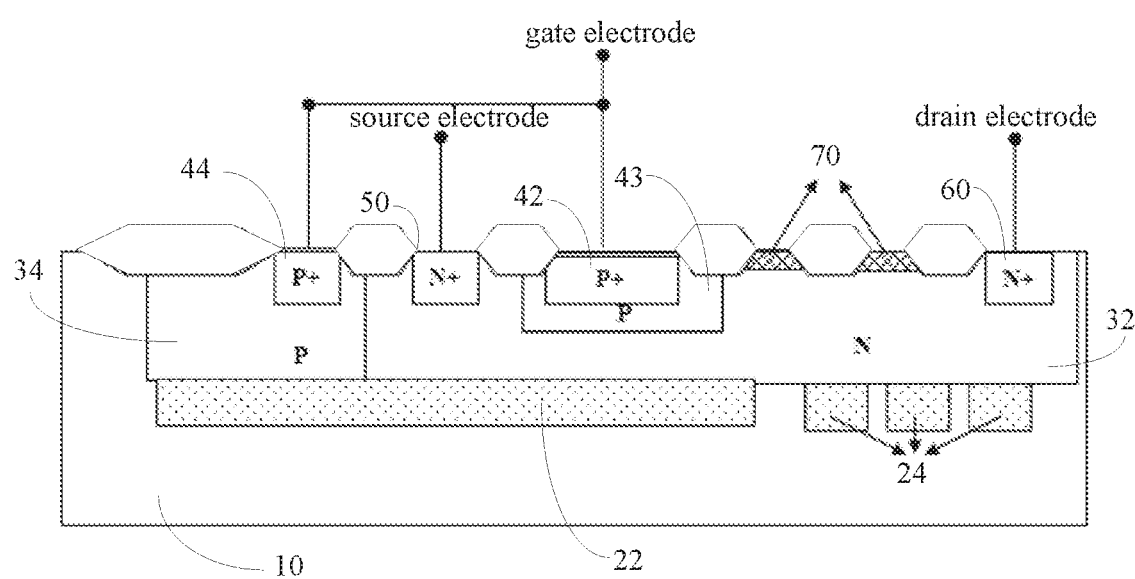
FIG. 1 is a schematic view of a junction field effect transistor according to an embodiment.

Referring to FIG. 1, a junction field effect transistor according to an embodiment includes a substrate 10, a buried layer formed in the substrate 10, a first well region 32 and a second well region 34 formed on the buried layer, a first gate lead-out region 42, a source lead-out region 50 and a drain lead-out region 60 formed in the first well region 32, and a second gate lead-out region 44 formed in the second well region 34. In the embodiment, the buried layer includes a buried P-type well 22, the first well region 32 is a N-type well, the second well 34 is a P-type well, the first gate lead-out region 42 and the second gate lead-out region 44 are P+-type lead-out regions. The source lead-out region 50 and the drain lead-out region 60 are N+-type lead-out regions. The first well region 32 is provided with a Schottky junction 70 on a surface thereof, specifically, the Schottky junction 70 is located between the first gate lead-out region 42 and the drain lead-out region 60, and is isolated from the first gate lead-out region 42 and the drain lead-out region 60 by an isolation structure such as field oxide). In the embodiment, the first well region 32 is a deep N-type well, serving as a N-type drift region withstanding a high voltage. Opposite ends of the first well region 32 are led out via the N+-type source lead-out region 50 and the drain lead-out region 60, respectively, to serve as a source electrode and a drain electrode.

Aforementioned junction field effect transistor takes advantage of the Schottky junction 70 above the N-type well to form a depletion region in the N-type drift region of the N-type well, so as to deplete the drift region, thereby achieving an object of improving the breakdown voltage. The number of the Schottky junctions 70 can be multiple, and the plurality of Schottky junctions 70 can he isolated from each other by isolation structures. The N-type drift region can be effectively depleted by modifying the number and the size dimension of the Schottky junctions 70 and adjusting an interval between the Schottky junctions 70.

The Schottky junction 70 can adopt a well-known metal or metal silicide (including Salicide, Silicide and Polycide) such as aluminum and cobalt silicide and so on, which can form a Schottky junction with N-type silicon.

In the occasion that the Shottky junction 70 is provided, if the N-type drift region cannot be depleted completely, a P-type island 24 can be formed beneath the first well region 32 by ion implantation. The P-type island 24 and the buried P-type well 22 can be formed by the same photolithography and ion implantation step, and an additional photolithography/ion implantation step is not required to reduce a cost. The P-type island 24 is mainly located on a position beneath the first well region 32 and adjacent to the drain lead-out region 60, and is isolated from the buried P-type well 22. The number of the P-type islands 24 can be multiple according to a requirement. The plurality of P-type islands 24 can be isolated from each other. The photo mask for photolithography of the buried P-type well is reasonably designed, the number and the size dimension of the P-type islands 24 and an interval between the P-type islands 24 are adjusted, and an appropriate island shape is formed by implantation, thereby an effective concentration of the P-type islands 24 is adjusted. The P-type islands 24 and the Shottky junction 70 deplete the N-type drift region completely together, meeting a requirement of a high breakdown voltage.

In the embodiment shown in FIG. 1, the junction field effect transistor further includes a P-type implantation region 43 located in the first well region 32. The first gate lead-out region 42 is located in the P-type implantation region 43. The P-type implantation region 43 is provided to act an effect of adjusting a pinch-off voltage.

Figure 2:
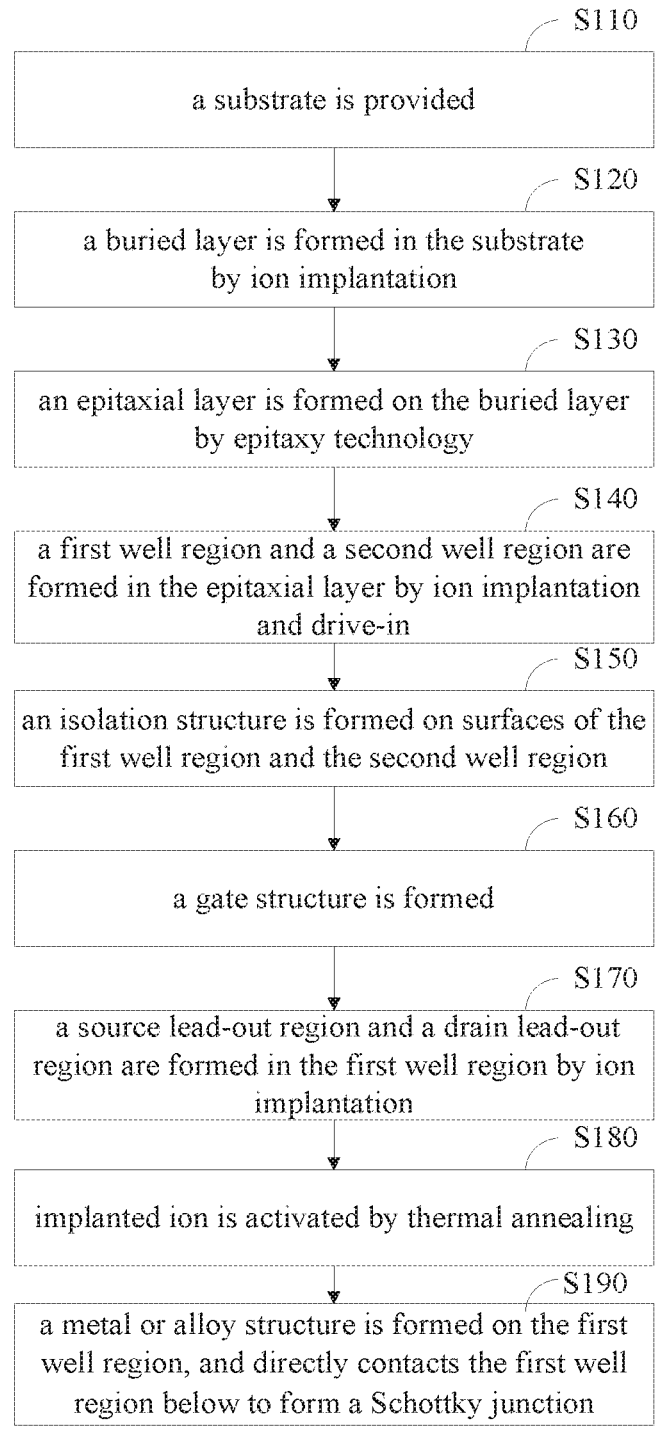
FIG. 2 is a flow chart of a method of manufacturing junction field effect transistor according to an embodiment.

Referring to FIG. 2, in one embodiment, a method of manufacturing the above junction field effect transistor includes steps as follows:

In step S110, a substrate is provided;

In the embodiment, a P-type substrate is provided.

In step S120, a buried layer is formed in the substrate by ion implantation.

In the embodiment, the buried layer includes a buried P-type well and a P-type island. After implantation windows of the buried layer P-type well and the P-type island are defined by photolithography, the buried P-type well and the P-type island are formed by performing a P-type ion implantation, the P-type island and the buried P-type well are isolated from each other by the substrate.

In step S130, an epitaxial layer is formed on the buried layer by epitaxy technology.

In step S140, a first well region and a second well region are formed in the epitaxial layer by ion implantation and drive-in.

N-type ion and P-type ion are implanted after the photolithography, after drive-in process, the N-type well serves a first well region, the P-type well serves as a second well region. Viewed from internal structures of the device, the buried P-type well formed in the step S120 extends from a position beneath the P-type well to a position beneath the N-type well, the P-type island is located beneath the N-type well.

In step S150, an isolation structure is formed on surfaces of the first well region and the second well region.

The isolation structure can be an alignment reference for the subsequent implantation of the gate electrode, the source electrode and the drain electrode. In the embodiment, the field oxide is employed as the isolation structure.

In step S160, a gate structure is formed.

In the embodiment, forming the P+-type first gate lead-out region in the N-type well by ion implantation and the P+-type second gate lead-out region in the P-type well by ion implantation, forming a gate oxide on the first gate lead-out region and the second gate lead-out region by a thermal oxidation, thrilling a polysilicon gate on the gate oxide by deposition all are included. In the embodiment, forming a sidewall structure (Spacer) on sides of the polysilicon gate is further included.

In step S170, a source lead-out region and a drain lead-out region are formed in the first well region by ion implantation.

The isolation structures between the N+-type source lead-out region and the first gate lead-out region, between the N+-type source lead-out region and the second gate lead-out region, isolate the N+-type source lead-out region from the first gate lead-out region, and isolate the N+-type source lead-out region from the second gate lead-out region. The N+-type drain lead-out region and the first gate leading region are also isolated from each other by the isolation structure. However, the isolation structure between the drain lead-out region and the P+-type first gate lead-out region is discontinuous, a portion of the N-type well in the middle portion is not covered by the isolation structure.

In step S180, implanted ion is activated by thermal annealing.

In step S190, a metal or alloy structure is formed on the first well region, and directly contacts the first well region below to form a Schottky junction.

The metal/alloy structure above the isolation structure which is located between the drain lead-out region and the first gate lead-out region directly contacts the part of the N-type region which is exposed, thereby forming the Schottky junction. The metal or alloy structure can adopt a well-known metal or metal silicide (including Salicide, Silicide and Polycide) such as aluminum and cobalt silicide and so on which can form a Schottky junction with the N-type silicon In above method of manufacturing junction field effect transistor, the P-type island in the JFET which forms a combined action with the Schottky junction to deplete the N-type drift region completely is formed by a same photolithography and ion implantation step of the P-type buried layer, and forming the metal and the alloy structure in step S190 does not require adding additional steps. Therefore, on basis of improving the breakdown voltage, an increase of photolithography cost is eliminated.

The above are several embodiments of the present invention described in detail, and should not be deemed as limitations to the scope of the present invention. It should be noted that variations and improvements will become apparent to those skilled in the art to which the present invention pertains without departing from its spirit and scope. Therefore, the scope of the present invention is defined by the appended claims.

What is claimed is:

1. A junction field effect transistor, comprising:
   a substrate;
   a buried layer formed in the substrate;
   a first well region and a second well region formed on the buried layer;
   a source lead-out region, a drain lead-out region, and a first gate lead-out region which are formed in the first well region; and a second gate lead-out region formed in the second well region;

wherein the substrate has a second doping type, the buried layer comprises a second doping type buried layer, the first well region has a first doping type, the second well region has the second doping type, the first gate lead-out region and the second gate lead-out region have the second doping type, the source lead-out region and the drain lead-out region have the first doping type, the first doping type and the second doping type have opposite conductivity types, the first well region is provided with a Schottky junction on a surface thereof, the Schottky junction is located between the first gate lead-out region and the drain lead-out region, and the Schottky junction is isolated from the first gate lead-out region and the drain lead-out region by an isolation structure.

2. The junction field effect transistor according to claim 1, wherein the first doping type is N-type, the second doping type is P-type.

3. The junction field effect transistor according to claim 2, wherein the second doping type buried layer comprises a buried P-type well and a P-type island, the buried P-type well extends from a position beneath the second well region to a position beneath the first well region, the P-type island is located beneath the first well region and is isolated from buried P-type well by the substrate.

4. The junction field effect transistor according to claim 3, wherein the P-type island and the buried P-type well are formed by the same photolithography and ion implantation step.

5. The junction field effect transistor according to claim 1, further comprising a second doping type implantation region formed in the first well region, wherein the first gate lead-out region is located in the second doping type implantation region.

6. The junction field effect transistor according to claim 1, wherein the Schottky junction is formed by direct contact of the first well region and metal or metal silicide.

7. The junction field effect transistor according to claim 1, wherein the isolation structure is a field oxide structure.

8. A method of manufacturing junction field effect transistor, comprising steps as follows:
   providing a substrate;
   forming a buried layer in the substrate by ion implantation;
   forming an epitaxial layer on the buried layer by epitaxy technology;
   forming a first well region and a second well region in the epitaxial layer by ion implantation and drive-in;
   forming an isolation structure on surfaces of the first well region and the second well region, the isolation structure provides an alignment reference for subsequent formation of a gate electrode, a source electrode and a drain electrode;
   forming a gate structure comprising a first gate lead-out region formed in the first well region, a second gate lead-out region formed in the second well region, a gate oxide formed on the first gate lead-out region and the second gate lead-out region, and a polysilicon gate formed on the gate oxide;
   forming a source lead-out region and a drain lead-out region in the first well region by ion implantation;
   activating implanted ions by thermal annealing; and
   forming a metal or alloy structure on the first well region, wherein a portion of the isolation structure between first gate lead-out region and the drain lead-out region has a discontinuous structure, thereby enabling the metal or alloy structure in the region to directly contact the first well region below to form a Schottky junction,
   wherein the substrate has a second doping type, the buried layer comprises a second doping type buried layer, the first well region has a first doping type, the second well region has the second doping type, the first gate lead-out region and the second gate lead-out region have the second doping type, the source lead-out region and the drain lead-out region have the first doping type, the first doping type and the second doping type have opposite conductivity types.

9. The method according to claim 8, wherein the first doping type is N-type, the second doping type is P-type.

10. The method according to claim 9, wherein forming the buried layer in the substrate by ion implantation comprises: defining implantation windows of a buried P-type well and a P-type island by photolithography, forming the P-type island beneath a first region which will be the first well region and the buried P-type well which extends from a position beneath a second region which will be the second well region to a position beneath the first region by ion implantation, wherein the P-type island and the buried P-type well are isolated by the substrate.

11. The method according to claim 8, wherein after forming the isolation structure on surfaces of the first well region and the second well region, and prior to forming the gate structure, the method further comprises: forming a second doping type implantation region in the first well region by ion implantation, wherein the first gate lead-out region is located in the second doping type implantation region.

12. The method according to claim 8, wherein the isolation structure is a field oxide structure.

13. The method according to claim 8, wherein forming the gate structure further comprises forming a sidewall structure on a sidewall of the polysilicon gate.

* * * * *